Nov. 29, 1960 W. M. BRITTAIN 2,962,604
LOGIC CIRCUITS
Filed July 26, 1957

WITNESSES

Edwin E. Bassler

Myron E. Click

INVENTOR

Willard M. Brittain

BY

F. E. Browder

ATTORNEY

United States Patent Office 2,962,604

Patented Nov. 29, 1960

2,962,604

LOGIC CIRCUITS

Willard M. Brittain, Amherst, N.Y., assignor to Westinghouse Electric Corporation, East Pittsburgh, Pa., a corporation of Pennsylvania Filed July 26, 1957, Ser. No. 674,398

6 Claims. (Cl. 307—88.5)

This invention relates to logic circuitry in general and in particular to logic circuitry utilizing transistors.

The use of digital techniques in modern computer and automation systems has led to the development of several different types of logic circuits. A large number of these logic circuits, in the interests of reliability, have as their main components semiconductor devices. These devices, known extensively as "transistors," are small in size, are very durable and appear to have a long useful life.

The junction transistor comprises, in general, a body of semiconductive material having two zones of one conductivity type separated by a zone of the opposite conductivity type. Thus, the device may be either the N-P-N or P-N-P type. If the transistor is of the P-N-P type, the emitter electrode is normally biased positively to be in a relatively conducting or forward direction, and the collector electrode negatively to be in a relatively non-conducting direction, each with respect to the base electrode. For the N-P-N type, these polarities are reversed.

With the increasing use of the computers and automation in general, there are an increasing number of applications wherein new types of logic circuitry will give better results.

It is, accordingly, an object of this invention to provide an improved logic circuit.

It is another object of this invention to provide a logic circuit which will perform a multiplicity of functions.

Other objects of this invention will become apparent from the following description when taken in conjunction with the accompanying drawings. In said drawings, for illustrative purposes only, there are shown preferred forms of this invention.

Figure 1:
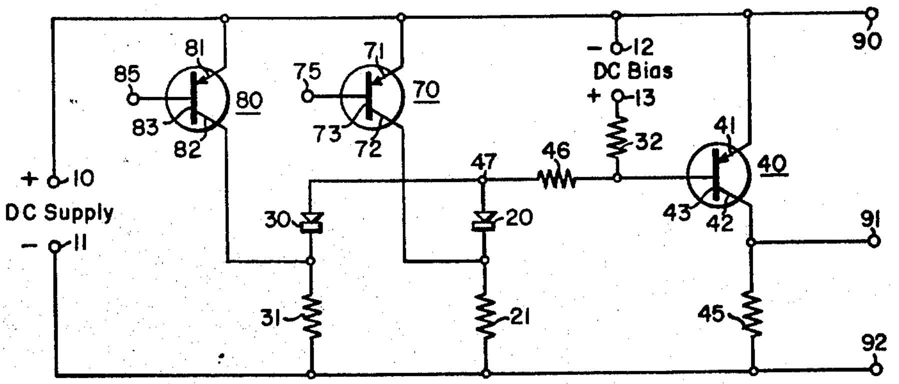
Fig. 1 is a schematic diagram illustrating a logic circuit embodying the teachings of this invention.

Referring to Fig. 1, there is illustrated a logic circuit utilizing semiconductor devices. In general, this embodiment comprises terminal means 10 and 11 for applying a direct current supply source, a main semiconductor device 40, input means for the logic circuit shown here as semiconductor devices 70 and 80, and output means for the logic circuit at the terminals 90, 91 and 92.

The semiconductor 40 comprises an emitter electrode 41, a collector electrode 42 and a base electrode 43. The emitter electrode 41 is connected to the terminal 10 and the terminal 90. The collector electrode 42 is connected to the terminal 11 through a resistor 45. The terminal 91 is connected to the junction of the collector electrode 42 and the resistor 45. The terminal 92 is connected to the terminal 11. The base electrode 43 is connected to a terminal 47 through a resistor 46. The base electrode 43 is connected to the emitter electrode 41 by a resistor 32 and a pair of terminals 12 and 13. The terminal 47 is connected to the terminal 11 by two parallel circuits, one including a rectifier 20 and a resistor 21, and the other including a rectifier 30 and a resistor 31.

A direct current supply source, with polarity as shown, is connected to the terminals 10 and 11. The terminal 10 is connected to the junction of the rectifier 20 and the resistor 21 by an emitter electrode 71 and a collector electrode 72 of the semiconductor 70. A base electrode 73 of the semiconductor 70 is connected to an input terminal 75. The terminal 10 is also connected to the junction of the rectifier 30 and the resistor 31 by an emitter electrode 81 and a collector electrode 82 of the semiconductor 80. The base electrode 83 of the semiconductor 80 is connected to an input terminal 85.

A direct current bias source, smaller in voltage magnitude than the direct current supply source connected to the terminals 10 and 11, with polarity as shown in Fig. 1, is to be connected to the terminals 12 and 13 and will bias the semiconductor 40 to cutoff when there is no signal applied to the base electrode 43. Since the semiconductor 40 employed in the embodiment illustrated in Fig. 1 is of the P-N-P type, it will not conduct when the base electrode 43 is at a positive polarity with respect to the emitter electrode 41. Therefore, with no signal to the base electrode 43, the semiconductor 40 is cut off and an output voltage across the semiconductor 40 at the terminals 90 and 91 may be obtained. That is, there can be no current flow from the terminal 10 to the terminal 11 from the direct current source connected to the terminals 10 and 11 through the semiconductor 40.

The semiconductors 70 and 80 operate as input switching means, that is, the input signal as a base drive furnished the semiconductors 70 and 80 at the input terminals 75 and 85, respectively, is assumed to be of the proper polarity and magnitude to either cut off or saturate the input switching semiconductors 70 and 80. Therefore, if a negative input signal furnishing a base drive to the semiconductor 70 is applied to the terminal 75, the semiconductor 70 will be saturated and conduct. Current flow will be from the terminal 10 through the emitter electrode 71 and the collector electrode 72 of the semiconductor 70 and the resistor 21 to the terminal 11. The junction of the rectifier 20 and the resistor 21 will effectively be at the potential of the terminal 10. The semiconductor 80 operates in the same manner when it receives a negative input signal at the terminal 85 which drives it to saturation. Thus, the junction of the rectifier 30 and the resistor 31 will also be effectively at the potential of the terminal 10.

The placing of the junctions of the rectifier 20, resistor 21 and the rectifier 30, resistor 31 at the potential of the terminal 10 by the proper input signals at input terminals 75 and 85, respectively, also places the terminal 47 at the potential of the terminal 10. The emitter electrode 41 will now be at substantially the same potential as the base electrode 43, and the direct current bias source connected to the terminals 12 and 13 will bias the semiconductor 40 to cutoff. With the semiconductor 40 cut off, there will be an output voltage at the terminals 90 and 91 and no output voltage at the terminals 91 and 92.

When no negative input signal is applied to the terminals 75 and 85, or to only one of the terminals 75 and 85, the potential of the terminal 47 will not be effectively the potential of the terminal 10. The semiconductor 40 will be biased to conduct by the application of the direct current supply source connected to the terminals 10 and 11 to the emitter electrode 41 and to the base electrode 43 by at least one of the plurality of legs connected to the terminal 47. Current flows from the terminal 10 through the emitter 41 and collector 42 of the semiconductor 40 and the resistor 45 to the terminal 11. There will now be no output voltage at the terminals 90 and 91 across the semiconductor 40, and there will be an output voltage at the terminals 91 and 92 across the resistor 45.

A plurality of legs containing a resistor and diode may be connected between the terminal 47 and the terminal 11. A plurality of input switching semiconductors may be connected in the manner shown between the junction of the rectifier and the resistor of each leg and the terminal 10. It can be seen that when taking the output signal from the terminals 90 and 91 that a logic function will be performed. That is, only when all of a plurality of positive inputs are present is there not a signal at the terminals 90 and 91. This could be termed a "NOT-AND" function. It can also be seen that by taking the output from the terminals 91 and 92 that an output will be present only when all of a plurality of positive inputs are present. This is the common "AND" function.

Figure 2:
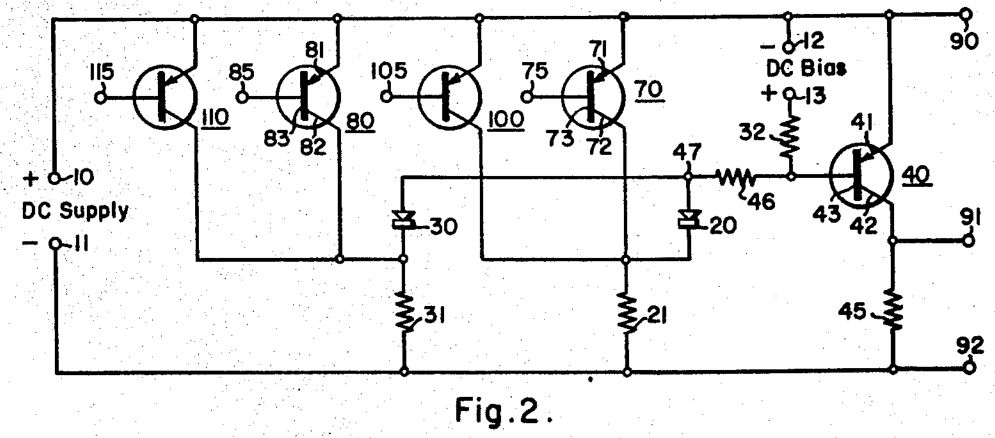
Fig. 2 is a schematic diagram of a second embodiment of this invention.

Referring to Fig. 2, there is illustrated another embodiment of the teaching of this invention, in which like components of Figs. 1 and 2 have been given the same reference characters. The main distinction between the apparatus illustrated in Figs. 1 and 2 is that in Fig. 2 an additional input semiconductor 100 and an additional input semiconductor 110 has been connected in parallel with the semiconductors 70 and 80, respectively.

The operation of the additional input switching semiconductors 100 and 110 is the same as the input semiconductors 70 and 80. That is, when a negative input signal is applied to the input terminals 105 or 115 of the input semiconductors 100 and 110, respectively, the junction of the rectifier 20, resistor 21 or rectifier 30, resistor 31, respectively, will be placed effectively at the potential of the terminal 10.

In the language of logic circuitry, when using positive input signals we now have the "NOT-AND" circuit of the apparatus illustrated in Fig. 1 when taking the output from the terminals 90 and 91 with "OR" inputs for each leg of the input circuit connected between the terminals 47 and 11.

When using positive input signals and when taking the output signal from the terminals 91 and 92, the apparatus illustrated in Fig. 2 is an "AND" circuit with "OR" inputs on each leg of the input circuit connected between the terminals 47 and 11.

Figure 3:
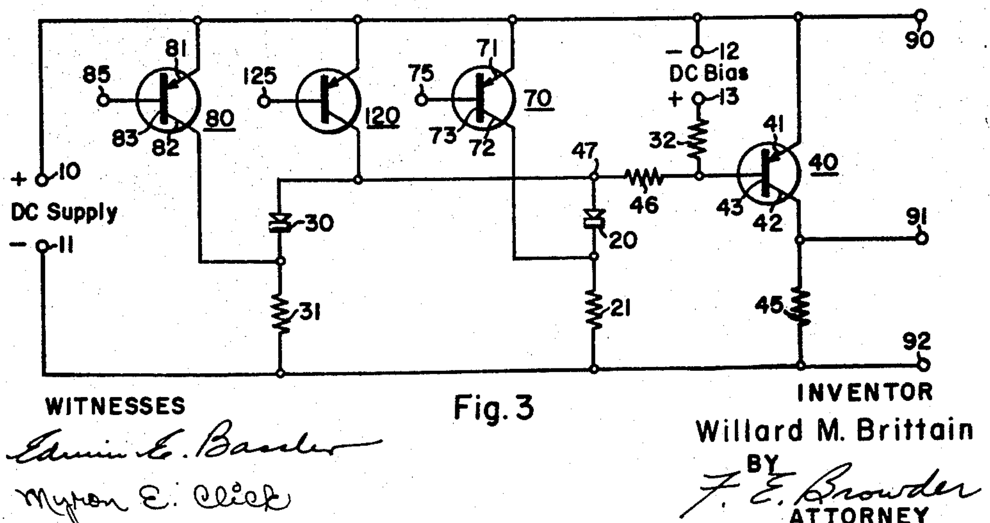
Fig. 3 is a schematic diagram of a third embodiment of the teachings of this invention.

Referring to Fig. 3, there is illustrated another embodiment of the teachings of this invention, in which like components of Figs. 1 and 3 have been given the same reference characters. The main distinction between the apparatus illustrated in Figs. 1 and 3 is that in Fig. 3 an input switching semiconductor 120 has been added between the terminal 10 and the terminal 47. A plurality of input switching semiconductors may be connected in the manner of the semiconductor 120. The operation of the input semiconductor 120 is the same as the input semiconductors hereinbefore described with the exception that a negative input to the semiconductor 120 at its input terminal 125 is sufficient in itself to bias the semiconductor 40 to cutoff since it is connected directly to the terminal 47.

Thus, when using positive input signals and when taking the output signal of the circuit from the terminals 90 and 91, we have what may be referred to as a "[NOT-AND]-OR" logic function being performed. That is, it will take all of the plurality of positive inputs to the input switching semiconductors connected in the manner of the semiconductors 70 and 80 to cause the output signal at the terminals 90 and 91 to cease. However, a single positive input to an input switching semiconductor connected in the manner of the semiconductor 120 will cause the output at the terminals 90 and 91 to cease.

When using positive input signals and when taking the output from the terminals 91 and 92, we have an "AND-OR" logic function. That is, all of a plurality of positive inputs to the input switching semiconductors connected in the manner of the semiconductors 70 and 80 must be present before there is an output at the terminals 91 and 92. However, when any one of a plurality of positive inputs is present to a semiconductor connected in the manner of the semiconductor 120, there will be an output from the terminals 91 and 92.

It is to be noted that the aforementioned logic functions may be performed by biasing the input switching semiconductors to cutoff with a positive bias and then applying a negative input signal. In this case the output for the proper function would be obtained from the opposite set of output terminals as opposed to the positive input signal.

In conclusion, it is pointed out that while the illustrated examples constitute practical embodiments of my invention, I do not limit myself to the exact details shown, since modifications of the same may be varied without departing from the spirit of this invention.

I claim as my invention:

1. In a semiconductor logic circuit, in combination, a semiconductor device having an emitter electrode, a base electrode, and a collector electrode, a source of direct current voltage, a first impedance means, a second impedance means, means for connecting said direct current voltage across said first impedance means and the emitter, base, and collector connected in series with said first impedance means, said base electrode being connected through said second impedance means to said collector electrode through a plurality of parallel circuits, said parallel circuits each including a unidirectional current conducting device, said base being also connected to said emitter electrode by input switching means, and means for deriving an output from said logic circuit.

2. In a semiconductor logic circuit, in combination, a semiconductor device having an emitter electrode, a base electrode, and a collector electrode, a source of direct current voltage, a first impedance means, a second impedance means, a plurality of other impedance means, means for connecting said direct current voltage and said first impedance means in series with said collector electrode, base electrode, and emitter electrode, said base electrode being connected through said second impedance means to said collector electrode by a plurality of parallel circuits, each of said parallel circuits including a unidirectional current conducting means and one of said other impedance means, said base electrode being connected to said emitter electrode by input switching means, means for biasing said semiconductor device to cutoff in the absence of a proper conducting potential on said semiconductor device, and means for deriving an output from said logic circuit.

3. In a semiconductor logic circuit, in combination, a semiconductor device having an emitter electrode, a base electrode, and a collector electrode, a first source of direct current voltage, a source of biasing direct current voltage of lesser magnitude than said first direct current voltage, a first impedance means, a second impedance means, a biasing voltage control impedance, a plurality of other impedance means, means for connecting said direct current voltage and said first impedance means in series with said collector electrode, base electrode, and emitter electrode, said base electrode being connected through said second impedance means to said collector electrode by a plurality of parallel circuits, each of said parallel circuits including a unidirectional current conducting means and one of said other impedance means, said base electrode being connected to said emitter electrode by input switching means, said biasing direct current voltage being connected, through said biasing voltage control impedance, across the base electrode and emitter electrode to thus constitute means for biasing said semiconductor device to cutoff in the absence of a proper conducting potential on said semiconductor device, and means for deriving an output from said logic circuit.

4. In a semiconductor logic circuit, in combination, a semiconductor device having an emitter electrode, a base electrode, and a collector electrode, a source of direct current voltage, a first impedance means, a second impedance means, a plurality of other impedance means, means for connecting said direct current voltage and said first impedance means in series with said collector electrode, base electrode, and emitter electrode, said base electrode being connected through said second impedance means to said collector electrode by a plurality of parallel circuits, each of said parallel circuits including a unidirectional current conducting means and one of said other impedance means, a plurality of input switching means, each junction of the unidirectional device and the particular one of said other impedance means with which it is connected in series being connected respectively through one of said plurality of input switching means to said emitter electrode, means for biasing said semiconductor device to cutoff in the absence of proper conducting potential on said semiconductor device, and means for deriving an output from said logic circuit.

5. In a semiconductor logic circuit, in combination, a semiconductor device having an emitter electrode, a base electrode, and a collector electrode, a source of direct current voltage, a first impedance means, a second impedance means, a plurality of other impedance means, means for connecting said direct current voltage and said first impedance means in series with said collector electrode, base electrode, and emitter electrode, said base electrode being connected through said second impedance means to said collector electrode by a plurality of parallel circuits, each of said parallel circuits including a unidirectional current conducting means and one of said other impedance means, a plurality of input switching means, each junction of the unidirectional device and the particular one of said other impedance means with which it is connected in series being connected, respectively, through one of said plurality of input switching means to said emitter electrode, the junction between said second impedance means and said plurality of parallel circuits being connected through one of said plurality of input switching means to said emitter electrode, means for biasing said semiconductor device to cutoff in the absence of proper conducting potential on said semiconductor device, and means for deriving an output from said logic circuit.

6. In a semiconductor logic circuit, in combination, a semiconductor device having an emitter electrode, a base electrode, and a collector electrode, a first source of direct current voltage, a source of biasing direct current voltage of lesser magnitude than said first direct current voltage, a first impedance means, a second impedance means, a biasing voltage control impedance, a plurality of other impedance means, means for connecting said direct current voltage and said first impedance means in series with said collector electrode, base electrode, and emitter electrode, said base electrode being connected through said second impedance means to said collector electrode by a plurality of parallel circuits, each of said parallel circuits including a unidirectional current conducting means and one of said other impedance means, a plurality of input switching means, each junction of the unidirectional device and the particular one of said other impedance means with which it is connected in series being connected, respectively, through one of said plurality of input switching means to said emitter electrode, the junction between said second impedance means and said plurality of parallel circuits being connected through one of said plurality of input switching means to said emitter electrode, means for biasing said semiconductor device to cutoff in the absence of proper conducting potential on said semiconductor device, and means for deriving an output from said logic circuit.

References Cited in the file of this patent

UNITED STATES PATENTS

| | | |
|---|---|---|
| 2,622,211 | Trent | Dec. 16, 1952 |
| 2,628,346 | Burkhart | Feb. 10, 1953 |
| 2,636,133 | Hussey | Apr. 21, 1953 |
| 2,658,142 | St. John | Nov. 3, 1953 |
| 2,676,271 | Baldwin | Apr. 20, 1954 |
| 2,679,617 | Mullaney et al. | May 25, 1954 |
| 2,712,065 | Elbourn et al. | June 28, 1955 |
| 2,724,061 | Emery | Nov. 15, 1955 |
| 2,745,956 | Baker | May 15, 1956 |

FOREIGN PATENTS

| | | |
|---|---|---|
| 205,117 | Australia | Jan. 4, 1957 |